United States Patent [19]

Taylor

[11] Patent Number: 5,764,082
[45] Date of Patent: Jun. 9, 1998

[54] CIRCUITS, SYSTEMS AND METHODS FOR TRANSFERRING DATA ACROSS A CONDUCTIVE LINE

[75] Inventor: Ronald T. Taylor, Grapevine, Tex.

[73] Assignee: Cirrus Logic, Inc., Fremont, Calif.

[21] Appl. No.: 681,661

[22] Filed: Jul. 29, 1996

[51] Int. Cl.$^6$ .................................................. H03K 19/097
[52] U.S. Cl. .................. 326/81; 326/86; 326/90
[58] Field of Search .................. 326/81, 80, 86, 326/88, 90, 92

[56] References Cited

U.S. PATENT DOCUMENTS

| | | | |
|---|---|---|---|
| 4,687,953 | 8/1987 | Varadarajan | 326/90 |
| 5,585,744 | 12/1996 | Runas et al. | 326/86 |
| 5,644,252 | 7/1997 | Watarai | 326/86 |
| 5,644,255 | 7/1997 | Taylor | 326/81 |

Primary Examiner—Tan T. Nguyen
Attorney, Agent, or Firm—James J. Murphy; Steven A. Shaw

[57] ABSTRACT

A system 500 is provided for transferring signals across a bus which includes a power source 550 operating between a high voltage rail at a first supply voltage level and a low voltage rail at a second supply voltage rail, power source 550 generating a third supply voltage level on an output thereto. The third supply voltage level is greater than the first supply voltage level. A processing circuitry 103, 104 is included for generating a plurality of data signals each having a first voltage swing between a first logic high level substantially equal to the first supply voltage level and a first logic low level substantially equal to the second supply voltage level. The system additionally includes a plurality of buffers, 520, each buffer 520 being coupled to the power source 550 output and receiving a selected one of the data signals. Each buffer 520 generates a boosted drive signal having a second voltage swing between a second logic high level substantially equal to the third supply voltage level and a second logic low level substantially equal to the second supply voltage level.

20 Claims, 3 Drawing Sheets

CIRCUITS, SYSTEMS AND METHODS FOR TRANSFERRING DATA ACROSS A CONDUCTIVE LINE

TECHNICAL FIELD OF THE INVENTION

The present invention relates in general to electronic circuits and systems and, in particular, to circuits, systems and methods for transferring data across a conductive line.

BACKGROUND OF THE INVENTION

In designing high performance integrated circuits, the need to transfer addresses and data across a bus at high speed is a critical consideration. This is especially true in applications where a memory, a high performance state machine, and numerous other integrated circuits are coupled together by a bus. One such instance is the bus between a display controller and, a frame buffer memory. In this case, substantial amounts of data, and the corresponding addresses, must be transferred between the graphics controller and the frame buffer at rates high enough to support display refresh and update, and other processing operations, such as filtering. As display systems with increased resolution and bit depths are developed, the rate at which data must be transferred between the controller and the frame buffer consequently increases.

Many personal computers (PCs) use a common bus to couple together a central processing unit (CPU), a memory, a display controller and other integrated circuits. These circuits can both send and receive data on the bus. Many of these circuits are capable of disabling the output stage by placing the bus line driver in a high impedance (Hi-Z) state. The high impedance state allows other integrated circuits to drive the bus line without interference from the disabled circuit.

CMOS line drivers consisting of a P-channel transistor and an N-channel transistor are well known in the art. CMOS line drivers are capable of driving a bus line from a Logic 1 equal to the $V_{CC}$ power supply rail voltage and a Logic 0 equal to the $V_{SS}$ power supply rail voltage of the integrated circuit. However, if the processing system includes external devices that drive the bus line higher than $V_{CC}$, then a forward-biased diode is formed by the drain of the P-channel device (which is coupled to the bond pad of the integrated circuit) and the substrate. This may initate latch-up (especially in DRAM circuits) or cause some other failure.

N-channel MOSFET (NEET) line drivers consisting of two N-channel transistors in series are also well known in the art. Replacing the P-channel device with a second N-channel device solves the above described latch-up problem. However, the NFET line driver has a degraded Logic 1 level of $V_{CC}$-$V_{TN}$, where $V_{TN}$ is typically 0.5 volts. This proves to be detrimental if the level of $V_{CC}$ is 3.3 volts and external circuits are TTL devices. Since the tolerance of $V_{CC}$ is typically 10%, the CMOS Logic 1 level of the N-FET line driver could be as low as (3.0–0.5)=2.5 volts. Since the TTL Logic 1 input level is typically 2.4 volts, the noise margin has an unacceptably low value of (2.5–2.4)=0.1 volts.

Improved NFET line drivers incorporate a buffer circuit that drives the gate of the N-channel device coupled to the $V_{CC}$ supply rail to a "boosted" Logic 1 level, $V_{PP}$, higher than $V_{CC}$. The higher gate level allows the drain of the N-channel device to rise to $V_{PP}$-$V_{TN}$, which is higher than the degraded Logic 1 level of $V_{CC}$-$V_{TN}$. However, these buffer circuits consume a large amount of chip area and one buffer circuit is required for each bus line driver circuit.

Thus, the need has arisen for improved circuits, systems and methods for transferring data and/or addresses across the lines of a bus. Such circuits, systems and methods should advantageously avoid latch-up, retain large noise margins and consume a minimum amount of chip area. In particular, such circuits, systems and methods should be applicable to high performance integrated circuit applications, such as display controllers and semiconductor memories. Finally, such circuits, systems and methods should require neither expensive and complicated changes to the chip fabrication process nor a reduction in system performance for implementation.

SUMMARY OF THE INVENTION

According to one embodiment of the present invention, a system is provided for transferring signals across a bus. The system includes a power source operating between a high voltage rail at a first supply voltage level and a low voltage rail at a second supply voltage level. The power source generates a third supply voltage level, which is greater than the first supply voltage level. Processing circuitries included for generating a data signal having a first voltage swing between a first logic high level substantially equal to the first supply voltage level and a first logic low level substantially equal to the second supply voltage level. A buffer is coupled to the power source output and receives a data signal. The buffer generates a boosted drive signal having a second voltage swing between a second logic high level substantially equal to the third supply voltage level and a second low voltage level substantially equal to the second supply voltage level.

The principles of the present invention are further embodied in an integrated circuit for transmitting signals across a conductive line, the integrated circuit comprising processing circuitry operating between a first high voltage rail having a voltage level of $V_{CC}$ and a low voltage rail having a voltage level of $V_{SS}$, wherein the processing circuitry generates a plurality of input signals having a first voltage swine between a first logic high level substantially equal to $V_{CC}$ and a first logic low level substantially equal to $V_{SS}$. The integrated circuit further comprises a line driver for receiving the plurality of input signals, the line driver operating between a second high voltage rail having a voltage level of $V_{PP}$, wherein $V_{PP}$ is greater than $V_{CC}$, and the low voltage rail. The line driver comprises an input stage for receiving a selected one of the input signals and outputting a boosted signal, the boosted signal having a second voltage swing between a second logic high level substantially equal to $V_{PP}$ and a second logic low level substantially equal to $V_{SS}$ and an output stage operating between the first high voltage rail and the low voltage rail. The output stage comprises a first N-channel transistor having a source coupled to a select one of the plurality of lines and a drain coupled to the first high voltage rail and a second N-channel transistor having a drain coupled to the selected line and a source coupled to the low voltage rail.

The principles of the present invention are further embodied in an integrated circuit for transmitting signals across a plurality of conductive lines, the integrated circuit comprising 1) a power source operating between a high voltage rail having a voltage level of $V_{CC}$ and a low voltage rail having a voltage level of $V_{SS}$, the power source generating a voltage level of $V_{PP}$ on an output of the power source, wherein $V_{PP}$ is greater than $V_{CC}$, 2) processing circuitry generating a plurality of data signals having a first voltage swing between a first logic high level substantially equal to $V_{CC}$ and a first logic low level substantially equal to $V_{SS}$, and 3) a plurality of buffers, wherein each of the buffers is coupled to the power source output and receives a selected one of the data signals, and wherein each of the buffers generates a boosted drive signal having a second voltage swing between a second logic high level substantially equal to $V_{PP}$ and a second logic low level substantially equal to $V_{SS}$.

The foregoing has outlined rather broadly the features and technical advantages of the present invention in order that the detailed description of the boosted N-channel line driver circuit that follows may be better understood. Additional features and advantages of the boosted N-channel line driver circuit will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–6 of the drawings, in which like numbers designate like parts. For purposes of illustration, the principles of the present invention will be described as if implemented in a display system frame buffer although these principles may be applied to a number of different data processing circuits and systems, as will become apparent from the discussion below.

Figure 1:
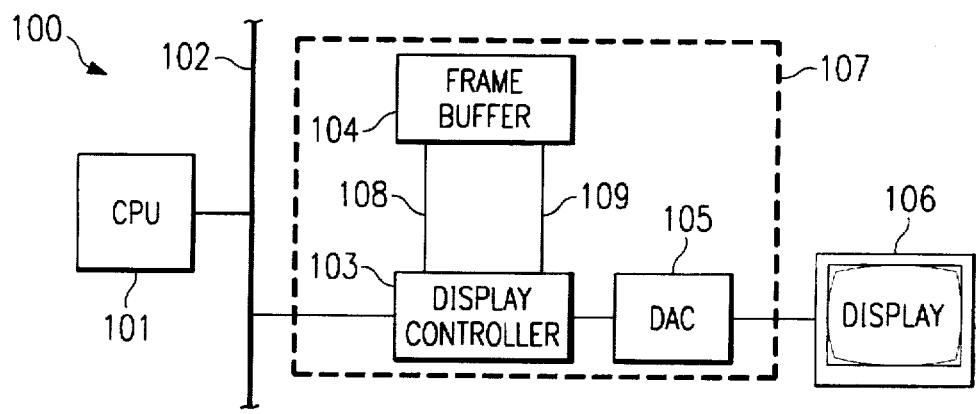
FIG. 1 is a functional block diagram of a display control system.

FIG. 1 is a high level functional block diagram of the portion of a processing system 100 controlling the display of graphics and/or video data. System 100 includes a central processing unit (CPU) 101, a system bus 102, a display controller 103, a frame buffer 104, a digital to analog converter (DAC) 105 and a display device 106. Display controller 103, frame buffer 104 and DAC 105 may be fabricated together on a single integrated circuit chip 107 or on separate chips. Display controller 103 and frame buffer 104 are coupled by an address bus 108 and an associated data bus 109 constructed in accordance with the principles of the present invention.

CPU ("master") 101 controls the overall operation of system 100, determines the content of graphics data to be displayed on display unit 106 under user commands, and performs various data processing functions. CPU 101 may be, for example, a general purpose microprocessor used in commercial personal computers. CPU 101 communicates with the remainder of system 100 via CPU bus 102, which may be, for example, a local bus, an ISA bus or a PCI bus. DAC 105 receives digital data from display controller 103 and outputs in response the analog data required to drive display 106. Depending on the specific implementation of system 100, DAC 105 may also include a color palette, YUV to RGB format conversion circuitry, and/or x- and y-zooming circuitry, to name a few options.

Display 106 may be for example a CRT unit or liquid crystal display, electroluminescent display (ELD), plasma display (PLD), or other type of display device which displays images on a display screen as a plurality of pixels It should also be noted that in alternate embodiments, "display" 106 may be another type of output device such as a laser printer or similar document view/print appliance.

Figure 2:
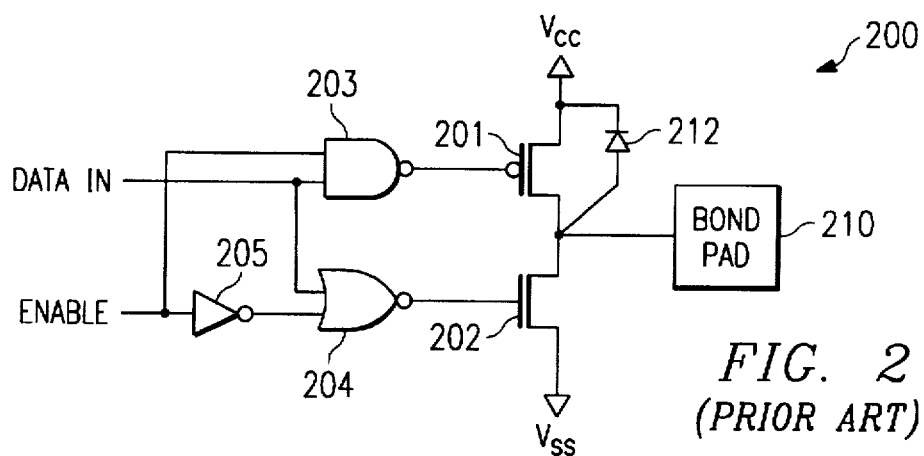
FIG. 2 is an electrical schematic diagram of bus line driver circuitry according to the prior art.

Before discussing the present invention, it is useful to describe in greater detail the problems inherent in prior art bus line drivers FIG. 2 is a prior art CMOS line driver capable of driving a bus line coupled to bond pad 210. Line driver 200 comprises P-channel transistor 201 and N-channel transistor 202. P-channel transistor 201 and N-channel transistor 202 form a CMOS inverter output stage that drives bond pad 210 between a Logic 1 level substantially equal to the $V_{CC}$ supply rail and a Logic 0 level substantially equal to the $V_{SS}$ supply rail.

When the ENABLE signal is low, the gate of P-channel transistor 201 is driven to Logic 1 and the gate of N-channel transistor 202 is driven to a Logic 0. Thus, when ENABLE is low, P-channel transistor 201 and N-channel transistor 202 are both OFF and the output stage of line driver 200 is in the high impedance state. When the ENABLE signal is high, the DATA IN signal is inverted by NOR gate 204 and NAND gate 203. The inverted value of DATA IN drives the gate of P-channel transistor 201 and N-channel transistor 202. The CMOS output stage then re-inverts the inverted DATA IN signal, such that the signal on bond pad 210 is in phase with DATA IN.

Line driver 200 is very effective for driving a bus line as long as the voltage level on bond pad 210 never exceeds the supply rail voltage, $V_{CC}$. If, however, an external, device drives the bus line and bond pad 210 above $V_{CC}$, diode 212 will conduct Diode 212 represents the diode formed by the P+diffusion and the N well in a standard ASIC N-well process. This may occur, for example, if line driver 200 is coupled to a $V_{CC}$ supply rail of 3.3 volts and the external device is a CMOS or TTL device operating from a supply voltage of 5.0 volts. If diode 212 conducts, then latch-up may occur on certain types of chips, such as DRAMS. Additionally, data may be lost if current is injected into the substrate from diode 212.

Figure 3:
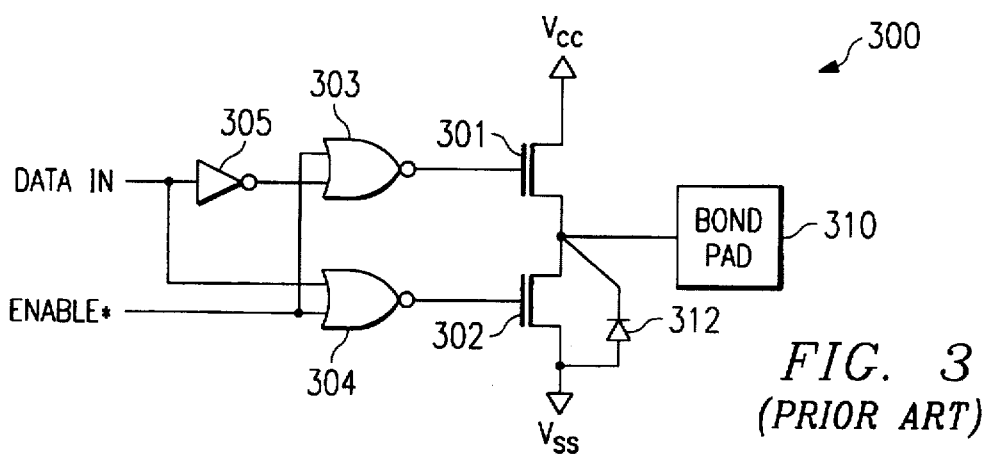
FIG. 3 is an electrical schematic diagram of bus line driver circuitry according to the prior art.

FIG. 3 depicts a second prior art line driver circuit 300, wherein the P-channel transistor has been replaced with a second N-channel transistor. The output stage of line driver 300, consisting of N-channel transistor 302 and N-channel transistor 301, drives bond pad 310 from a Logic 0 level substantially equal to $V_{SS}$, and a Logic 1 level substantially equal to $V_{CC}$-$V_{TN}$. The Logic 1 level is degraded because N-channel transistor 301 operates as a source follower and can only drive bond pad 310 to the supply voltage, $V_{CC}$, minus the threshold voltage, $V_{TN}$, of N-channel transistor 301.

Line driver 300 also comprises NOR gate 303 and NOR gate 304. When the ENABLE* signal is low, the DATA IN signal appears at the gate of N-channel transistor 301 and appears inverted at the gate of N-channel transistor 302. When the ENABLE* signal is high, the gates of N-channel transistors 301 and 302 are driven low and N-channel transistor 301 and N-channel transistor 302 are both "OFF".

Applying a voltage higher than $V_{CC}$ to bond pad 310 will not affect line driver 300 in the same way that line driver 200 is affected by such a voltage. This is because the diode formed by the N+ diffusion and the substrate; represented by diode 312, is reversed biased for all greater than $V_{SS}$ applied to bond pad 310. This effectively solves the latch-up problems described in FIG. 2.

However, as noted above, because N-channel transistor 301 operates as a source follower, line driver 300 can only drive bond pad 310 to a Logic 1 level of approximately $V_{CC}-V_{TN}$. Line driver 300 works acceptably well if $V_{CC}$ is approximately 5.0 volts and $V_{TN}$ is approximately 0.5 volts. In such a case, the Logic 1 output level is 4.5 volts, which is sufficient to drive a TTL bus well above the TTL Logic 1 level of 2.0 to 2.4 volts. But, line driver 300 is ineffective in driving bond pad 310 if $V_{CC}$ is reduced to 3.3 volts. Since the tolerance on the $V_{CC}$ supply voltage rail is generally +/-10%, $V_{CC}$ could be as low as 3.0 volts. If $V_{TN}$ is approximately 0.5 volts, then the Logic 1 output level could be as low as 2.5 volts. This leaves a noise margin of only 2.5 −2.4=0.1 volts. The low margin also means that the Logic 0 to Logic 1 transition will be unacceptably slow. Furthermore, if there is any resistive termination on the bus line driven by line driver 300, then the TTL Logic 1 level of 2.4 volts may not be met even if infinite time is available.

Figure 4:
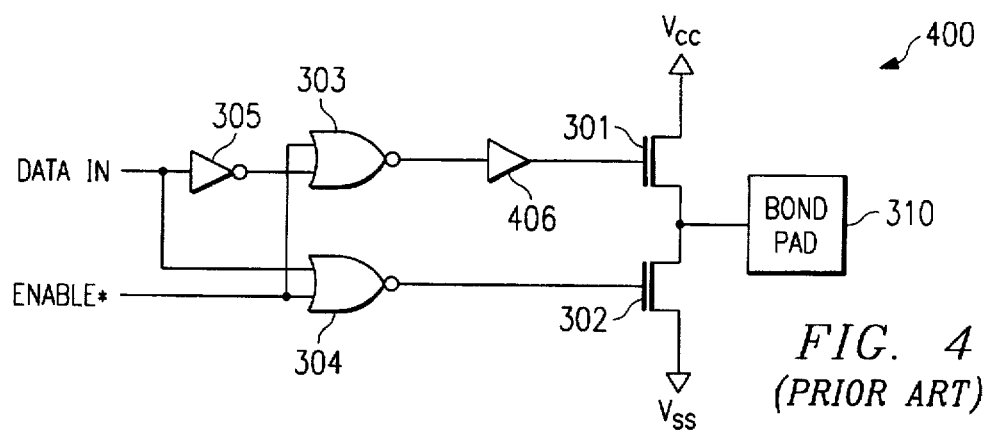
FIG. 4 is an electrical schematic diagram of bus line driver circuitry according to the prior art.

FIG. 4 depicts prior art line driver 400, which is an improvement over line driver 300 in FIG. 3. Line driver 400 is similar in most respects to line driver 300, except for buffer 406. Inserted between NOR gate 303 and N-channel transistor 301. Buffer 406 receives a Logic 1 from NOR gate 303 approximately equal to $V_{CC}$, and outputs a Logic 1 to the gate of N-channel transistor 301 hat is greater than $V_{CC}$.

Buffer 406 contains a charge pump that stores a voltage, $V_{PP}$, on a large capacitor within buffer 406. $V_{PP}$ is higher than $V_{CC}$ by at least the threshold voltage, $V_{TN}$, of N-channel transistor 301 The voltage $V_{PP}$ is connected to the output stage (typically a CMOS inverter) of buffer 406 The output stage of buffer 406 thus pulls the gate of N-channel transistor 301 up to $V_{PP}$. This in turn allows the source of N-channel transistor 301 and bond pad 310 to be pulled all the way up to $V_{CC}$.

The added circuitry of buffer 406 increases the complexity of line driver 400 and requires a large amount of chip area, a problem that is exacerbated when line driver 400 is incorporated in integrated circuits that drive large buses such as a 32-bit or a 64-bit bus. Thus, the storage capacitor is typically designed to be just large enough to pull up the gate of N-channel transistor 301 under narrowly specified operating conditions. The result is that buffer 406 typically cannot cycle from low to high over a wide enough frequency range to prevent failure under some conditions.

Failure occurs because buffer 406 must store the energy needed to boost the gate of N-channel transistor 301 in a large storage capacitor. If buffer 406 is switching at high speed, buffer 406 may partially discharge the storage capacitor as a result of a large amount of "crowbar" current that flows through both the N-channel transistor and the P-channel transistor in an output stage during the transitions between Logic 1 and Logic 0. This problem may be worsened by variances between individual devices as a result of manufacturing process. If timing conditions are just right and the input switching conditions are correct, it is possible to "catch" the storage capacitor with a less than full charge when the gate of N-channel transistor 301 must be pulled high. This type of fault is exceedingly difficult to detect.

Figure 5:
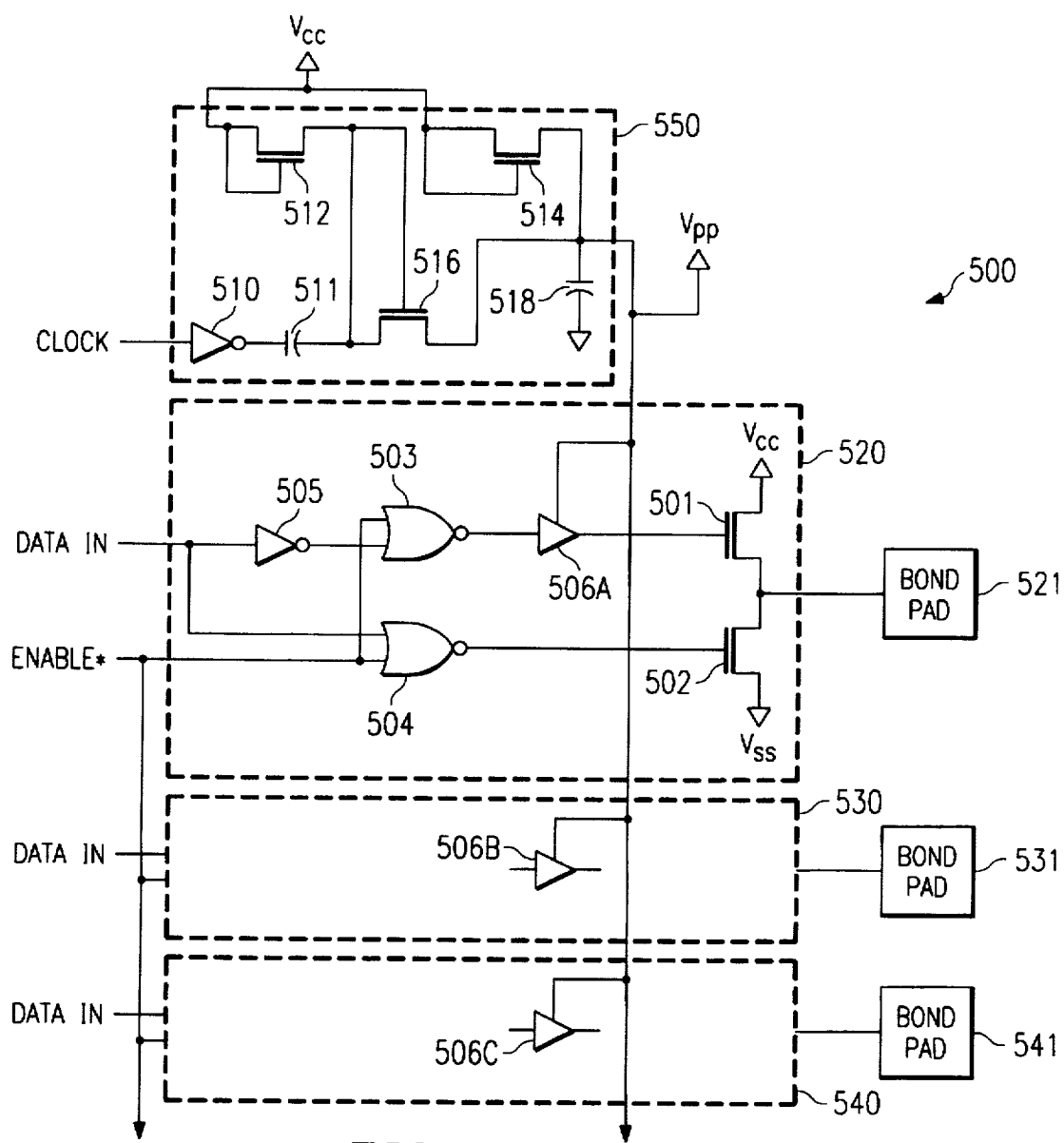
FIG. 5 is an electrical schematic diagram of a boosted N-channel line driver circuit according to one embodiment of the present invention.

FIG. 5 depicts a boosted N-channel line driver according to one embodiment of the present invention. Integrated circuit 500 contains line driver 520 for transferring data across a transmission line, such as a given line 201 of address bus 108 or data bus 10. It should be noted that in system 100, line driver 520 could also be applied to the transfer of data and/or addresses between bus 102 and display controller 103, between display controller 103 and DAC 105, or between DAC 105 and display 106, to name only a few examples. Also, line driver 520 is assumed to be unidirectional for discussion purposes. It should be understood, however, that line driver 520 could be bidirectional, as well.

Integrated circuit (IC) 5 30 contains a plurality of line drivers 520, 530, and 540, which drive bond pads 521, 531 and 541 respectively. Each of line drivers 520, 530 and 540 contains an output stage comprised of two N-channel transistors, such as N-channel transistors 501 and 502 in line driver 520. The drain of N-channel transistor 501 is coupled to $V_{CC}$ and the source of N-channel transistor 501 is coupled to bond pad 521. The source of N-channel transistor 502 is coupled to $V_{SS}$ and the drain of N-channel transistor 501 is coupled to bond pad 521.

The gate of N-channel transistor 501 is driven by level shifter 506A. Level shifter 506A receives power from on-chip power source 550, which outputs a voltage level, $V_{PP}$, which is higher than $V_{CC}$. Level shifter 506A receives an input signal from NOR gate 503 having a Logic 0 level substantially equal to $V_{SS}$ and a Logic 1 level substantially equal to $V_{CC}$ and outputs on the gate of N-channel transistor 501 a signal having a Logic 1 level substantially equal to $V_{PP}$ and a Logic 0 level substantially equal to $V_{SS}$.

When the ENABLE* signal is Logic 0, bus line driver circuit 520, 530 and 540 are enabled and the signal DATA IN drives bond pads 521, 531 and 541. DATA IN is inverted by NOR gate 504 and the inverted value of DATA IN drives the gate of N-channel transistor 502. DATA IN is also inverted by inverter 505 and then re-inverted by NOR gate 503, so that the gate of N-channel transistor 501 is driven by a boosted signal that is in phase with DATA IN.

Thus, when DATA TN is high, bond pad 521 is driven high, and when DATA IN is low, bond pad 521 is driven low. Line drivers 530 and 540 operate in a similar fashion to line driver 520.

Power source 550 comprises N-channel transistors 512, 514 and 516, capacitors 511 and 518, and inverter 510. When power is first applied to IC 500, N-channel transistor 514 charges capacitor 518 to substantially the level of supply rail $V_{CC}$. The CLOCK signal inputs a pulse train to inverter 510.

When the output of inverter 510 is Logic 0, N-channel transistor 512 turns "ON" and charges capacitor 511 to a voltage level of approximately $V_{CC}V_{TN}$. When the output of inverter 510 switches to Logic 1, the opposite side of capacitor 511 jumps to approximately $2V_{CC}-V_{TN}$. This in turn causes N-channel transistor 512 to turn "OFF" and causes N-channel transistor 516 to turn "ON". When N-channel transistor 516 turns "ON", the charge on capacitor 518, which represents the voltage $V_{PP}$, is raised to approximately $2V_{CC}-2V_{TN}$. Thus, every cycle of the pulse train of the CLOCK signal places charge on capacitor 518.

Capacitor 518 in power source 550 is a very large storage element that supplies the voltage $V_{PP}$ to a plurality of level shifters 506A–506C on IC 500. As noted above, level shifter 506A (and similarly level shifters 506B and 506C) receives an input signal from NOR gate 503 having a Logic 0 level substantially equal to $V_{SS}$ and a Logic 1 level substantially equal to $V_{PP}$ and outputs on the gate of N-channel transistor 501 a signal having a Logic 1 level substantially equal to $V_{PP}$ and a Logic 0 level substantially equal to $V_{SS}$.

The use of a separate power source 550 to supply cower to a plurality oft level shifters 506A–506C provides a less complex and more reliable circuit for boosting the signal on the gates of the source-follower N-channel transistors (such as N-channel transistor 501) in line drivers 520, 530 and 540. Capacitor 518 cannot be discharged by any single line driver because capacitor 518 is many times larger than the storage capacitor in buffer 406. For example, if IC 500 contained thirty-two (32) line drivers similar to line driver 520, capacitor 518 would be at least 32 times larger than the corresponding storage capacitor in buffer 406 of line driver 400.

Thus, even if line driver 520 is switching at a very high frequency, line driver 520 is unable to discharge capacitor 518. It is extremely unlikely that all of the line drivers in IC 500 will be simultaneously switching at very high frequency. It is also extremely unlikely that the timing of the switching of the line drivers in IC 500 will be aligned so that the line drivers all simultaneously discharge capacitor 518. Thus, the problem previously discussed regarding the discharge of the storage capacitor in buffer 406 in FIG. 4 is overcome. The design of line drivers 520, 530 and 540 is further simplified because power source 550 and large storage capacitor 518 may advantageously be fabricated in an area of IC 500 remote from line drivers 520, 530 and 540.

Figure 6:
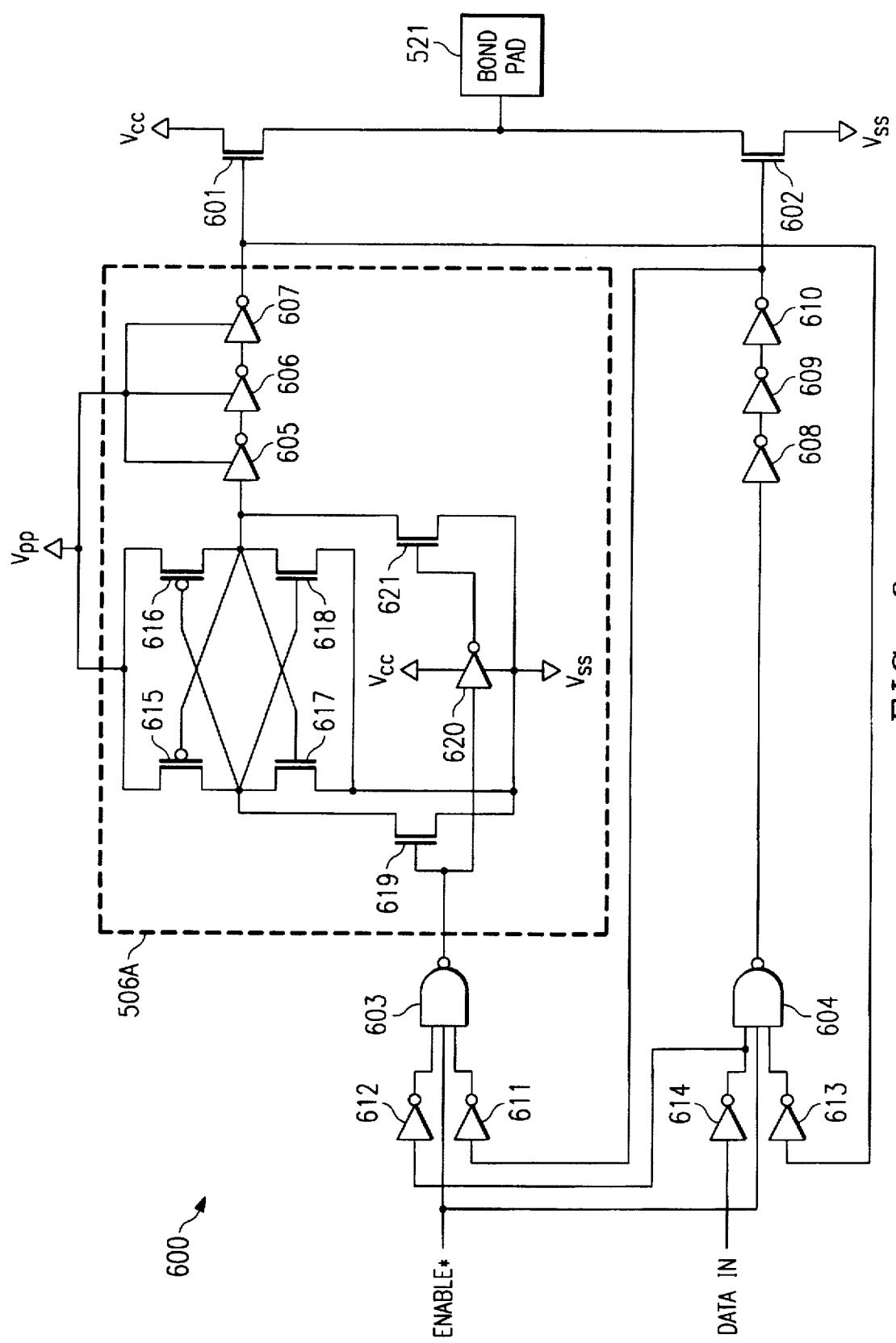
FIG. 6 is a more detailed electrical schematic diagram of the boosted N-channel line driver circuit in FIG. 5.

FIG. 6 is an alternate embodiment of line driver 520. Line driver 600 drives bond pad 521 using an output stage consisting of very large N-channel transistors 601 and 602. An exemplary embodiment of level shifter 506A is used to drive N-channel transistor 601, which is a source follower.

When ENABLE* is low, DATA IN, which is inverted by inverter 614 and re-inverted by inverter 612, is inverted again by NAND gate 603, so that the inverted value of DATA IN is presented to the input of level shifter 506A. The inverted DATA IN drives the gate of N-channel transistor 619<DATA IN is inverted again by inverter 620, which switches between $V_{CC}$ and $V_{SS}$. The in-phase value of DATA IN drives the gate of N-channel transistor 621. Thus, whenever N-channel transistor 619 is "ON", N-channel transistor 621 is "off", and vice versa.

Because they are always out of phase with one another, N-channel transistor 619 and N-channel transistor 621 drive the inputs of a regenerative latch formed by P-channel transistors 615 and 616 and N-channel transistors 617 an 618 in a "push-pull" fashion. The regenerative latch is connected to the $V_{PP}$ power supply rail produced by power source 550 so that the output of the regenerative latch drives inverter 605 between $V_{SS}$ and $V_{PP}$. Thus, the $V_{CC}$-to-$V_{SS}$ switching levels on the output of NAND gate 603 are converted to $V_{PP}$-to-$V_{SS}$ switching levels at the input of inverter 605.

Inverters 605, 606 and 607 increase the current driving capability of level shifter 506A in order to drive very large N-channel transistor 601 in the output stage of line driver 600. Similarly, inverters 608, 609 and 610 increase the current driving capability of NAND gate 604 in order to drive very large N-channel transistor 602 in the output stage of line driver 600. Whenever ENABLE* is low, the in-phase value of DATA IN appears on the gate of N-channel transistor 601 and the inverted value of DATA IN appears on the gate of N-channel transistor 602.

Although the present invention and its advantages have been described in detail, it should be understood that various changes, substitutions and alterations can be made herein without departing from the spirit and scope of the invention as defined by the appended claims.

What is claimed is:

1. A system for transferring signals across a bus, said system comprising a power source operating between a high voltage rail at a first voltage level and a low voltage rail at a second supply voltage level, said power source generating a third supply voltage level on an output of said power source, wherein said third supply voltage level is greater than said first supply voltage level;

processing circuitry generating a plurality of data signals having a first voltage swing between a first logic high level substantially equal to said first supply voltage level and a first logic low level substantially equal to said second supply voltage level; and a plurality of level shifting circuits, wherein each of said level shifting circuits is coupled to said power source output and receives a selected one of said data signals, and wherein each of said level shifting circuits generates a boosted drive signal having a second voltage swing between a second logic high level substantially equal to said third supply voltage level and a second logic low level substantially equal to said second supply voltage level.

2. The system as set forth in claim 1 further comprising a plurality of output stages, each of said output stages receiving a selected one of said boosted drive signals and comprising:

a first N-channel transistor having a source coupled to a selected one of said plurality of conductive lines and a drain coupled to said high voltage rail; and a second N-channel transistor having a drain coupled to said selected conductive line and a source coupled to said low voltage rail.

3. The system as set forth in claim 2 wherein said third supply voltage level greater than said first supply voltage level by at least a threshold voltage of said first N-channel transistor.

4. The system as set forth in claim 1 wherein said power source comprises:

a storage capacitor for storing a charge; and a charge pump for charging said storage capacitor to said third voltage supply level.

5. The system as set forth in claim 4 wherein said charge pump comprises:

a second capacitor;

circuitry for charging said second capacitor; and circuitry for selectively coupling charge from said second capacitor to said storage capacitor.

6. A system for transferring signals across a bus, said system comprising a plurality of line drivers, each of said line drivers comprising:

an circuitry for receiving an input signal having a first voltage swing between a first logic high level substantially equal to $V_{CC}$ and a first logic low level substantially equal to $V_{SS}$, said input stage operating between a first high voltage rail having a voltage $V_{PP}$, wherein $V_{PP}$ is greater than $V_{CC}$, and a low voltage rail having a voltage level of $V_{SS}$, wherein said circuitry for receiving outputs a boosted signal, said boosted signal having a second voltage swing between a second logic high level substantially equal to $V_{PP}$ and a second logic low level substantially equal to $V_{SS}$; and an output stage operating between a second high voltage rail having a voltage level of $V_{CC}$ and said low voltage rail for receiving said boosted signal from said circuitry for receiving, said output stage comprising:

a first N-channel transistor having a source coupled to a selected one of said plurality of lines and a drain coupled to said second high voltage rail; and a second N-channel transistor having a drain coupled to said selected line and a source coupled to said low voltage rail.

7. The system as set forth in claim 6 wherein said voltage $V_{PP}$ is greater than said voltage $V_{CC}$ by at least a threshold voltage of said first N-channel transistor.

8. The system as set forth in claim 6 further comprising a power supply coupled to said first high voltage rail or generating said voltage $V_{PP}$.

9. The system as set forth in claim 8 wherein said power supply comprises:

a storage capacitor for storing a charge; and a charge pump operating between said second high voltage rail and said low voltage rail for charging said storage capacitor to said voltage $V_{PP}$.

10. An integrated circuit for transmitting signals across a plurality of conductive lines, said integrated circuit comprising:

processing circuitry operating between a first high voltage rail having a voltage level of $V_{CC}$ and a low voltage rail having a voltage level of $V_{SS}$, said processing circuitry generating a plurality of input signals having a first voltage swing between a first logic high level substantially equal to $V_{CC}$ and a first logic low level substantially equal to $V_{SS}$; and a plurality of line drivers for receiving said plurality of input signals, said plurality of line drivers operating between a second high voltage rail having a voltage level of $V_{PP}$, wherein $V_{PP}$ is greater than $V_{CC}$, and said low voltage rail, each of said line drivers comprising:

an circuitry for receiving a selected one of said input signals and outputting a boosted signal, said boosted signal having a second voltage swing between a second logic high level substantially equal to $V_{PP}$ and a second logic low level substantially equal to $V_{SS}$; and an output stage operating between said first high voltage rail and said low voltage rail, said output stage comprising:

a first N-channel transistor having a source coupled to a select one of said plurality of lines and a drain coupled to said first high voltage rail; and a second N-channel transistor having a drain coupled to said selected line and a source coupled to said low voltage rail.

11. The integrated circuit as set forth in claim 10 wherein said voltage $V_{PP}$, is greater than said voltage $V_{CC}$ by at least a threshold voltage of said first N-channel transistor.

12. The integrated circuit as set forth in claim 10 further comprising a power supply coupled to said second high voltage rail for generating said voltage $V_{PP}$.

13. The integrated circuit as set forth in claim 12 wherein said power supply comprises:

a storage capacitor for storing a charge; and a charge pump operating between said first high voltage rail and said low voltage rail for charging said storage capacitor to said voltage $V_{PP}$.

14. The integrated circuit as set forth in claim 12 wherein said power supply is disposed in an area of said integrated circuit remote from said plurality of line drivers.

15. An integrated circuit for transmitting signals across a plurality of conductive lines, said integrated circuit comprising:

a power source operating between a high voltage rail having a voltage level of $V_{CC}$ and a low voltage rail having a voltage level of $V_{SS}$, said power source generating a voltage level of $V_{PP}$ on an output of said power source, wherein $V_{PP}$ is greater than $V_{CC}$;

processing circuitry generating a plurality of data signals having a first voltage swing between a first logic high level substantially equal to $V_{CC}$ and a first logic low level substantially equal to $V_{SS}$; and a plurality of level shifters, wherein each of said level shifters is coupled to said power source output and receives a selected one of said data signals, and wherein each of said level shifters generates a boosted drive signal having a second voltage swing between a second logic high level substantially equal to $V_{PP}$ and a second logic low level substantially equal to $V_{SS}$.

16. The integrated circuit as set forth in claim 15 further comprising a plurality of output stages, each of said output stages receiving a selected one of said boosted drive signals and comprising:

a first N-channel transistor having a source coupled to a selected one of said plurality of conductive lines and a drain coupled to said high voltage rail; and a second N-channel transistor having a drain coupled to said selected conductive line and a source coupled to said low voltage rail.

17. The integrated circuit as set forth in claim 16 wherein said voltage $V_{PP}$ is greater than said voltage $V_{CC}$ by at least a threshold voltage of said first N-channel transistor.

18. The integrated circuit as set forth in claim 17 wherein said charge pump comprises:

A second capacitor;

logic circuitry for controlling charging of said second capacitor in response to a clock signal;

a first transistor for selectively coupling said second capacitor to said high voltage rail;

a second transistor for selectively coupling said second capacitor with said storage capacitor; and a third transistor for selectively coupling said storage capacitor to said high voltage rail.

19. The integrated circuit as set forth in claim 16 wherein said power source is disposed in an area of said integrated circuit remote from said plurality of buffers.

20. The integrated circuit as set forth in claim 1 wherein said power source comprises:

a storage capacitor for storing a charge; and a charge pump for charging said storage capacitor to said voltage $V_{PP}$.

* * * * *